(12) United States Patent
Fujita et al.

(10) Patent No.: US 7,185,259 B2
(45) Date of Patent: Feb. 27, 2007

(54) DECODING METHOD AND DECODING APPARATUS OF PRODUCT CODE

(75) Inventors: Hachiro Fujita, Tokyo (JP); Hideo Yoshida, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 385 days.

(21) Appl. No.: 10/209,923

(22) Filed: Aug. 2, 2002

(65) Prior Publication Data

US 2003/0070131 A1  Apr. 10, 2003

(30) Foreign Application Priority Data

Aug. 3, 2001  (JP) .............................. 2001-236692

(51) Int. Cl.
*H03M 13/00* (2006.01)
*H03M 13/03* (2006.01)

(52) U.S. Cl. .................... 714/755; 714/780; 714/794

(58) Field of Classification Search ................ 714/755, 714/756, 780, 774, 775
See application file for complete search history.

(56) References Cited

U.S. PATENT DOCUMENTS 5,563,897 A   10/1996 Pyndiah et al.
5,815,515 A   9/1998  Dabiri
5,968,199 A   10/1999 Khayrallah et al.
6,269,124 B1*  7/2001 Nagayasu et al. .......... 375/262
6,516,444 B1*  2/2003 Maru .......................... 714/795

FOREIGN PATENT DOCUMENTS

EP   0 967 730 A1   12/1999
JP   7-202722       8/1995

OTHER PUBLICATIONS

Elbaz, A.; Ryndiah, R.; Solaiman, B.; Ait Sab, O.; Iterative decoding of product codes with a priori information over a Gaussian channel for still image transmission, Global Telecommunications Conference, vol. 5, 1999 pp. 2602-2606.*

(Continued)

*Primary Examiner*—Joseph Torres
(74) *Attorney, Agent, or Firm*—Birch, Stewart, Kolasch & Birch, LLP

(57) ABSTRACT

A decoding method of a product code calculates a kth soft output value of each of r C1 codewords [$C^t$] (t=1, 2, ..., r) detected at a codeword generating step. Beginning from t=1, if a kth value of a C1 codeword [$C^t$] is zero, a first variable, with a predetermined initial value, is compared with the likelihood of the codeword. The first variable is substituted with the sum of a greater one of the first variable and the likelihood and a correction value of the difference between them. If the kth value is nonzero, then the second variable is updated in the same manner. The update of the first and second variables is carried out with incrementing t from one to r, and the kth soft output value is calculated from the difference between the first and second variables updated.

8 Claims, 7 Drawing Sheets

OTHER PUBLICATIONS

S. Benedetto, D. Divsalar, G. Montorsi, and F. Pollara, Soft-Output Decoding Algorithms in Iterative Decoding of Turbo Codes, TDA Progress Report 42-124 Feb. 15, 1996.*

IEEE Transactions on Communications, vol. 46, No. 8, pp. 1003-1010 (1998).

IEEE Transactions on Information Theory, vol. IT-18, No. 1, pp. 170-182 (1972).

Carlach, J.C. et al., "Soft-Decoding of Convolutional Block Codes for an Interactive Television Return Channel," 1997 IEEE 6th Int'l. Conference on Universal Personal communications Record, San Diego, Oct. 12-16, 1997, IEEE Int'l. Conference on Universal Personal Communications, New York, vol. 1, Conf. 6, Oct. 12, 1997, pp. 249-253.

Proakis, John G., "Digital Communications," 1995 McGraw-Hill, p. 246.

Dave, S., et al., "An Efficient Decoding Algorithm for Block Turbo Codes," IEEE Transactions on Communications, vol. 49, No. 1, Jan. 1, 2001, pp. 41-46.

* cited by examiner

US 7,185,259 B2

DECODING METHOD AND DECODING APPARATUS OF PRODUCT CODE

BACKGROUND OF THE INVENTION

1. Field of the Invention

The present invention relates to a decoding method and decoding apparatus of a product code for improving the reliability of a digital communication system or digital recording system.

2. Description of Related Art

Although error-correcting codes such as Reed-Solomon codes have been utilized to improve reliability of digital communication/recording systems, more powerful error-correcting codes have been required recently to meet increasing speed and capacity of the systems. In general, high performance correcting codes require complicated decoding, which makes it difficult to be built into a device. However, using concatenated codes or product codes makes it possible to implement high-performance coding rather easily. In particular, the product codes have an advantage that they have large redundancy and error-correcting power because of the double encoding of information data. Accordingly, they are applied as an error-correcting method of CD-ROMs and DVDs. FIG. 1 is a diagram showing a construction of a product code. In FIG. 1, a code in the vertical direction is a binary linear code C1 with a code length N1 and information length K1, and a code in the horizontal direction is a binary linear code C2 with a code length N2 and information length K2. The block 1 designates information data, and blocks 2–4 each designate a check (redundant check).

Next, a coding method of the product code will be described with reference to FIG. 1. First, K1×K2 bit-information data are stored in the two-dimensional array (block 1) with K1 rows and K2 columns. The block 1 is represented by expression (1), where $D_{i,j}$ (i=1, 2, ..., K1; j=1, 2, ..., K2) is 0 or 1.

$$\begin{bmatrix} D_{1,1} & D_{1,2} & \cdots & D_{1,K2} \\ D_{2,1} & D_{2,2} & \cdots & D_{2,K2} \\ \vdots & \vdots & \ddots & \vdots \\ D_{K1,1} & D_{K1,2} & \cdots & D_{K1,K2} \end{bmatrix} (Di, j = 0, 1) \quad (1)$$

Next, individual columns from the first to K2 th column are provided with (N1−K1)-bit checks of the C1 code to construct a two-dimensional array with N1-rows and K2-columns (construction of the block 2).

Subsequently, individual rows from the first to N1th row are provided with (N2−K2)-bit checks of the C2 code to construct a two-dimensional array with N1-rows and N2-columns (construction of the blocks 3 and 4).

FIG. 2 is a block diagram showing a configuration of a digital communication system utilizing a product code, which is disclosed in Japanese patent application laid-open No. 7-202722. In FIG. 2, the reference numeral 201 designates an encoder for encoding input information data; 202 designates a modulator for converting a product code generated by the encoder 201 into a signal suitable for a communication channel; 203 designates the communication channel; 204 designates a demodulator for demodulating a received signal sent via the communication channel and for converting it to demodulated data; and 205 designates a decoder for decoding the demodulated data demodulated by the demodulator to estimate the information data. The encoder 201 and modulator 202 constitute a transmitter, and the demodulator 204 and the decoder 205 constitute a receiver.

Next, the operation of the system as shown in FIG. 2 will be described. The input K1×K2-bit information data are supplied to the encoder 201 for generating the product code with N1 rows and N2 columns. The product code generated is represented by a matrix C of following Expression 2. Although the elements of the product code C is represented by the binary 0 or 1, the binary 0 is represented as "+1", and the binary 1 is represented by "−1" in the following.

$$C = \begin{bmatrix} C_{1,1} & C_{1,2} & \cdots & C_{1,N2} \\ C_{2,1} & C_{2,2} & \cdots & C_{2,N2} \\ \vdots & \vdots & \ddots & \vdots \\ C_{N1,1} & C_{N1,2} & \cdots & C_{N1,N2} \end{bmatrix} (C_{i,j} = \pm 1) \quad (2)$$

The product code generated by the encoder 201 is supplied to the modulator 202 to be converted into the signal suitable for the communication channel 203, and is transmitted through the communication channel. It is assumed about the communication channel 203 that additive noise is superimposed on a transmission signal. The signal received through the communication channel 203 is supplied to the demodulator 204 of the receiver.

The demodulator 204 carries out shaping of the received signal to generate the demodulated data Y (expression (3)), the components of which are represented as $Y_{i,j}=C_{i,j}+N_{i,j}$, where $N_{i,j}$ are noise components. The demodulated data Y generated by the demodulator 204 is supplied to the decoder 205 for estimating the transmitted information data. In the following description, the demodulated data Y is denoted by {Y}, and is referred to as an input matrix.

$$Y = \begin{bmatrix} Y_{1,1} & Y_{1,2} & \cdots & Y_{1,N2} \\ Y_{2,1} & Y_{2,2} & \cdots & Y_{2,N2} \\ \vdots & \vdots & \ddots & \vdots \\ Y_{N1,1} & Y_{N1,2} & \cdots & Y_{N1,N2} \end{bmatrix} \quad (3)$$

FIG. 3 is a flowchart illustrating the operation of the decoder 205. In FIG. 3, 301 is a step of inputting the input matrix {Y}; 302 is a step of setting initial values into a correction matrix {W} and a decision matrix {D}; 303A is a step of setting an initial value into a counter j; 304A is a step of calculating soft input vectors [$R_k$] (k=1, 2, ..., N1); 305A is a step of calculating soft output vectors [$L_k$] (k=1, 2, ..., N1); 306A is a step of updating the correction matrix {W}; 307A is a step of comparing the value of the counter j; and 308A is a step of incrementing the value of the counter j.

In addition, 303B is a step of setting an initial value into a counter i; 304B is a step of calculating soft input vectors [$R_k$] (k=1, 2, ..., N2); 305B is a step of calculating soft output vectors [$L_k$] (k=1, 2, ..., N2); 306B is a step of updating the correction matrix {W}; 307B is a step of comparing the value of the counter i; 308B is a step of incrementing the value of the counter i; 309 is a step of making a decision as to whether to iterate the decoding of the product code; and 310 is a step of outputting the decision matrix {D}.

Next, the operation will be described in more detail with reference to the flowchart of FIG. 3. First, at step 301, the N1×N2 input matrix {Y} given by the foregoing expression (3) is input. At the next step 302, the initial value zero is stored into all the elements of the N1×N2 correction matrix {W} given by the following expression (4).

$$W = \begin{bmatrix} W_{1,1} & W_{1,2} & \cdots & W_{1,N2} \\ W_{2,1} & W_{2,2} & \cdots & W_{2,N2} \\ \vdots & \vdots & \ddots & \vdots \\ W_{N1,1} & W_{N1,2} & \cdots & W_{N1,N2} \end{bmatrix} \quad (4)$$

Furthermore, initial values sgn{Y} are stored into all the elements of the N1×N2 decision matrix {D}. Specifically, the (i,j) elements $D_{i,j}$ of the decision matrix {D} is replaced by the code sgn($Y_{i,j}$) of the (i,j) elements $Y_{i,j}$ of the input matrix {Y}, where sgn is a function defined by the following expression (5).

$$\mathrm{sgn}(x) = \begin{cases} +1 & (x \geq 0) \\ -1 & (x < 0) \end{cases} \quad (5)$$

At step 303A, the initial value one is set into the counter j. At the next step 304A, decoding of the C1 code is started. At step 304A, jth column of the input matrix {Y} and the jth column of the correction matrix {W} are added element by element. Specifically, according to expression (6), the (k,j) elements $Y_{k,j}$ of the input matrix {Y} are added to the (k,j) elements $W_{k,j}$ of the correction matrix {W} to calculate the soft input values $R_k$ (k=1, 2, . . . , N1).

$$R_k \leftarrow Y_{k,j} + \alpha \cdot W_{k,j} \ (k=1, 2, \ldots, N1) \quad (6)$$

where α is an appropriate normalizing constant.

In the following description, the jth column of the input matrix is denoted by [$Y_{k,j}$], that of the decision matrix is denoted by [$D_{k,j}$], and that of the correction matrix is denoted by [$W_{k,j}$], which are called input vector, decision vector and correction vector, respectively, according to the foregoing Japanese patent application laid-open No. 7-202722. At step 305A, the decision vector [$D_{k,j}$] is updated and the soft output vector [$L_k$] (k=1, 2, . . . , N1) is calculated. The details of step 305A will be described later. At step 306A, the differences obtained by subtracting the soft input vector from the soft output vector calculated at step 305A are stored in the jth column of the correction matrix {W} according to the following expression (7).

$$W_{k,j} \leftarrow L_k - R_k \ (k=1, 2, \ldots, N1) \quad (7)$$

At step 307A, a decision is made as to whether the value of the counter j is less than N2. If it is less than N2, the value of the counter j is incremented at step 308A, followed by iterating the processing at step 304A and on. On the other hand, if the value of the counter j is N2, the processing proceeds to step 303B, at which the decoding of the C2 code is started. Up to this time, the update of all the elements of the correction matrix {W} has been completed.

At step 303B, the initial value one is set into the counter i. At the next step 304B, ith row of the input matrix {Y} and the ith row of the correction matrix {W} are added element by element. Specifically, according to the following expression (8), the (i,k) elements $Y_{i,k}$ of the input matrix are added to the (i,k) elements $W_{i,k}$ of the correction matrix to calculate the soft input values $R_k$ (k=1, 2, . . . , N2).

$$R_k \leftarrow Y_{i,k} + \alpha \cdot W_{i,k} \ (k=1, 2, \ldots, N2) \quad (8)$$

where α is an appropriate normalizing constant.

In the following description, the ith row of the input matrix is denoted by [$Y_{i,k}$], that of the decision matrix is denoted by [$D_{i,k}$], and that of the correction matrix is denoted by [$W_{i,k}$], which are called input vector, decision vector and correction vector, respectively, as in the decoding of the foregoing C1 code. At step 305B, the decision vector [$D_{i,k}$] is updated and the soft output vector [$L_k$] (k=1, 2, . . . , N2) is calculated. The details of step 305B will be described later. At step 306B, the differences obtained by subtracting the soft input vector from the soft output vector calculated at step 305B are stored in the ith rows of the correction matrix {W} according to the following expression (9).

$$W_{i,k} \leftarrow L_k - R_k \ (k=1, 2, \ldots, N2) \quad (9)$$

At step 307B, a decision is made as to whether the value of the counter i is less than N1. If it is less than N1, the value of the counter i is incremented at step 308B, followed by iterating the processing at step 304B and on. On the other hand, if the value of the counter i is N1, the processing proceeds to step 309. Up to this time, the decoding of the C1 code and C2 code constituting the product codes has been completed once. At step 309, a decision is made as to whether the decoding of the C1 code is iterated or not. Usually, the decoding is completed when the iterated decoding has been carried out by a predetermined number of times. To iterate the decoding of the C1 code, the processing proceeds to step 303A to restart the decoding of the C1 code. On the other hand, to stop the decoding, the processing proceeds to step 310, at which the decision matrix {D} is output. Thus, the decoding processing is completed.

The data $D_{i,j}$ (i=1, 2, . . . , K1; j=1, 2, . . . , K2) stored in the K1×K2 decision matrix {D} output at step 310 represent the information data estimated by the decoding. Although the elements of the decision matrix {D} take a value "±1", the value "+1" corresponds to a binary zero, and "−1" corresponds to a binary one.

Next, the soft input/soft output decoding of the C1 code at step 305A will be described. FIG. 4 is a flowchart illustrating the details of step 305A. Referring to FIG. 4, the operation will be described. At step 401, the soft input vector [$R_k$] and the decision vector [$D_k$] are input.

At step 402, p elements with least absolute values are selected from the soft input vector [R]. The positions of the p elements are denoted by k1, k2, . . . , and kp. At step 403, a test vector [$T_k$] is generated whose elements $T_{km}$=0 or 1 at the p positions km (m=1, 2, . . . , p) selected at step 402, with the remaining elements $T_k$=0 (k≠km). Since the total of q=$2^p$ test vectors are present, they are denoted as [$T^s$] (s=1, 2, . . . , q) using the suffix s. The resultant test vectors [$T^s$] and the decision vector [$D_k$] are added element by element to generate words [$U^s$] given by the following expression (10) for carrying out algebraic decoding of the C1 code. In expression (10), the elements "+1" and "−1" of the decision vector [$D_k$] is converted to a binary zero and one, respectively, and are subjected to modulo-2 addition.

$$[U^s] = [D_k] + [T^s] \ (s=1, 2, \ldots, q) \quad (10)$$

At step 404, r candidate codewords [$C^t$]=($C^t_1$, $C^t_2$, . . . , $C^t_{N1}$) (t=1, 2, . . . , r) are generated by decoding the q words [$U^s$] (s=1, 2, . . . , q) generated at step 403 using the algebraic decoding of the C1 code.

At step 405, Euclidean distances $M^t$ (t=1, 2, ..., r) are calculated between the soft input vector [R] and the candidate codewords [$C^t$]. The Euclidean distance $M^t$ between the soft input vector [R] and the candidate codewords [$C^t$] are given by the following expression (11).

$$M^t = \sum_{k=1}^{Nl} (R_k - C_k^t)^2 \quad (11)$$

At step 406, the codeword [$C^d$] that gives the minimum Euclidean distance ($M^t \geq M^d$) is selected. In addition, the codewords [$C^d$] are substituted into the decision vector according to the following expression (12).

$$[D] \leftarrow [C^d] \quad (12)$$

At step 407, the counter k is set at its initial value one, and the processing proceeds to step 408. At step 408, a decision is made as to whether any candidate codeword [$C^t$] (t=1, 2, ..., r) is present, the kth value $C_k^t$ of which differs from the kth value $C_k^d$ of the codeword [$C^d$] selected at step 406, that is, whether the codeword [$C^t$] that satisfies $C_k^t = -C_k^d$ is present or not. If it is not present, the processing proceeds to step 409. If it is present, the processing proceeds to step 410 at which a codeword that gives the least Euclidean distance among such codewords, which is called a concurrent codeword and denoted by [$C^c$], is selected, and the processing proceeds to step 411. At step 409, the soft output value given by the following expression (13) is calculated.

$$L_k \leftarrow \beta C_k^d \quad (13)$$

where $\beta$ is an appropriate value.

At step 411, the soft output value given by the following expression (14) is calculated.

$$L_k \leftarrow ((M^c - M^d)/4) C_k^d \quad (14)$$

where $M^c$ is a Euclidean distance between the concurrent codeword [$C^c$] and the soft input vector [R].

At step 412, a decision is made as to whether the value of the counter k equals N1 or not. If they are not equal, the processing proceeds to step 413, at which the value of the counter k is incremented by one to iterate the processing from step 408 and on. On the other hand, if they are equal, the processing proceeds to step 414, at which the soft output vectors [$L_k$] and the decision vectors [$D_k$] are output, followed by completing the entire processing. Thus, the soft input/soft output decoding of the C1 code at step 305A has been completed. The soft input/soft output decoding of the C2 code at step 305B is the same as that of the C1 code.

As seen from the foregoing expressions (13) and (14), the conventional soft output value is calculated using at most two codewords among the candidate codewords generated at step 404.

With the foregoing configuration, the conventional decoding method of a product code has a problem of being unable to reflect the information provided by the candidate codewords other than the codeword [$C^d$] and the concurrent codeword [$C^s$] closest to the soft input vectors in terms of the Euclidean distance among the many codewords found at the codeword generating step.

In addition, it has a problem of losing information about the correction vector obtained at the previous decoding in the update of the correction matrix. This is because the new correction vector is obtained by subtracting the soft input vector from the soft output vector calculated by the soft input/soft output decoding.

SUMMARY OF THE INVENTION

The present invention is implemented to solve the foregoing problems. It is therefore an object of the present invention to provide a decoding method and a decoding apparatus of a product code and a digital transmission system using a product code, which are capable of calculating the soft output value by effectively using the codewords obtained at the codeword generating step, and capable of improving the decoding performance by calculating more accurate correction values.

According to a first aspect of the present invention, there is provided a decoding method of a product code consisting of a binary linear C1 code and C2 code, the decoding method of a product code including the steps of: generating a first soft input value by adding a received value of the C1 code and a predetermined correction value; generating a first soft output value from the first soft input value by carrying out soft input/soft output decoding of the C1 code; updating the correction value by subtracting the received value of the C1 code from the first soft output value; generating a second soft input value by adding a received value of the C2 code and the correction value; generating a second soft output value from the second soft input value by carrying out soft input/soft output decoding of the C2 code; and estimating a transmitted codeword from the soft output value.

According to a second aspect of the present invention, there is provided a decoding apparatus of a product code consisting of a binary linear C1 code and C2 code, the decoding apparatus of a product code including: an adder for adding a received value and a correction value to generate a soft input value; a soft input/soft output decoder for generating a soft output value from the soft input value; a subtracter for subtracting the received value from the soft output value to generate the correction value; and a decision circuit for deciding decoded bits from the soft output value, wherein the soft input/soft output decoder includes: a first and second Chase decoding circuits for generating a candidate codeword of the C1 code and C2 code from the soft input value; a candidate codeword likelihood calculation circuit for generating a likelihood of the candidate codeword of at least one of the C1 code and C2 code; and a soft output value calculation circuit for generating the soft output value from the likelihood of the candidate codeword.

The decoding method and apparatus of a product code in accordance with the present invention offer an advantage of being able to generate a more accurate soft output value. In addition, since they use the correction value that reflects the previous decoding results in generating the soft input value, they can markedly improve the decoding performance.

DETAILED DESCRIPTION OF THE PREFERRED EMBODIMENTS

The invention will now be described with reference to the accompanying drawings.

Embodiment 1

Figure 1:
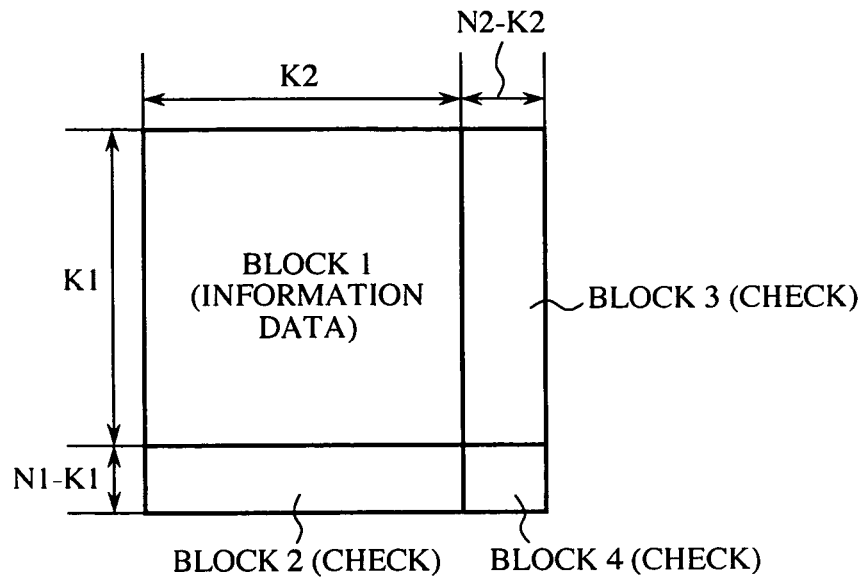
FIG. 1 is a diagram showing a construction of a product code.
Figure 2:
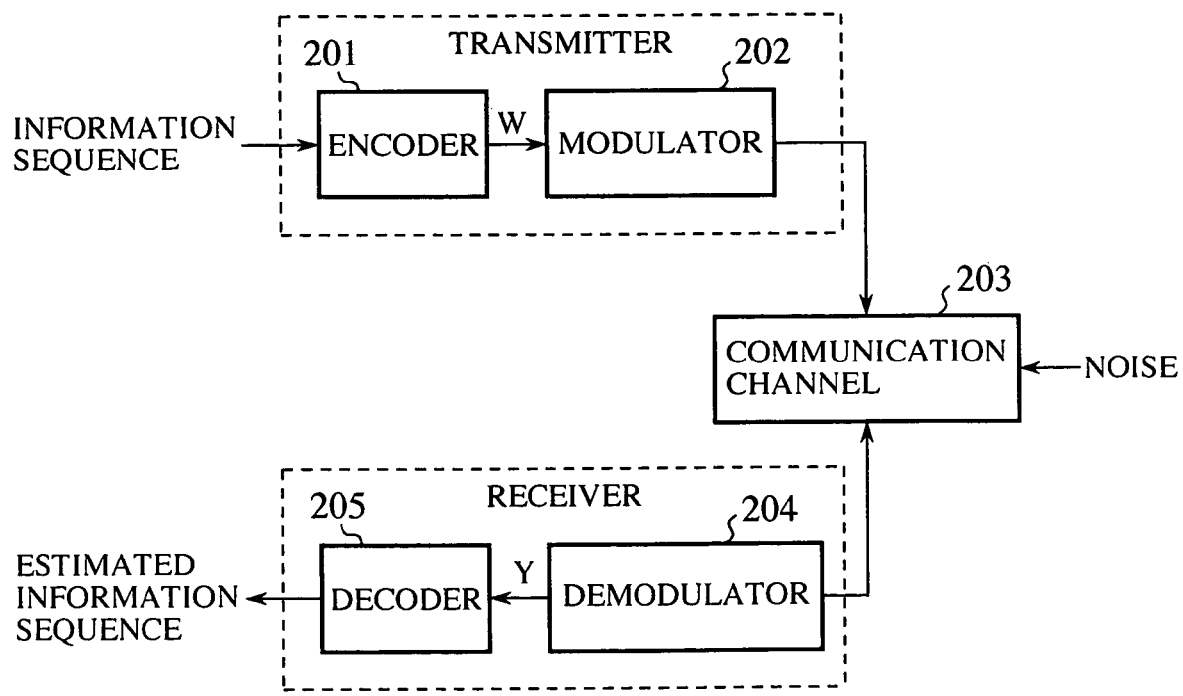
FIG. 2 is a block diagram showing a configuration of a digital communication system.

The decoding method of a product code of an embodiment 1 in accordance with the present invention will be described with reference to the accompanying drawings including the block diagram of the digital communication system as shown in FIG. 2, which is used to describe the prior art.

Figure 5:
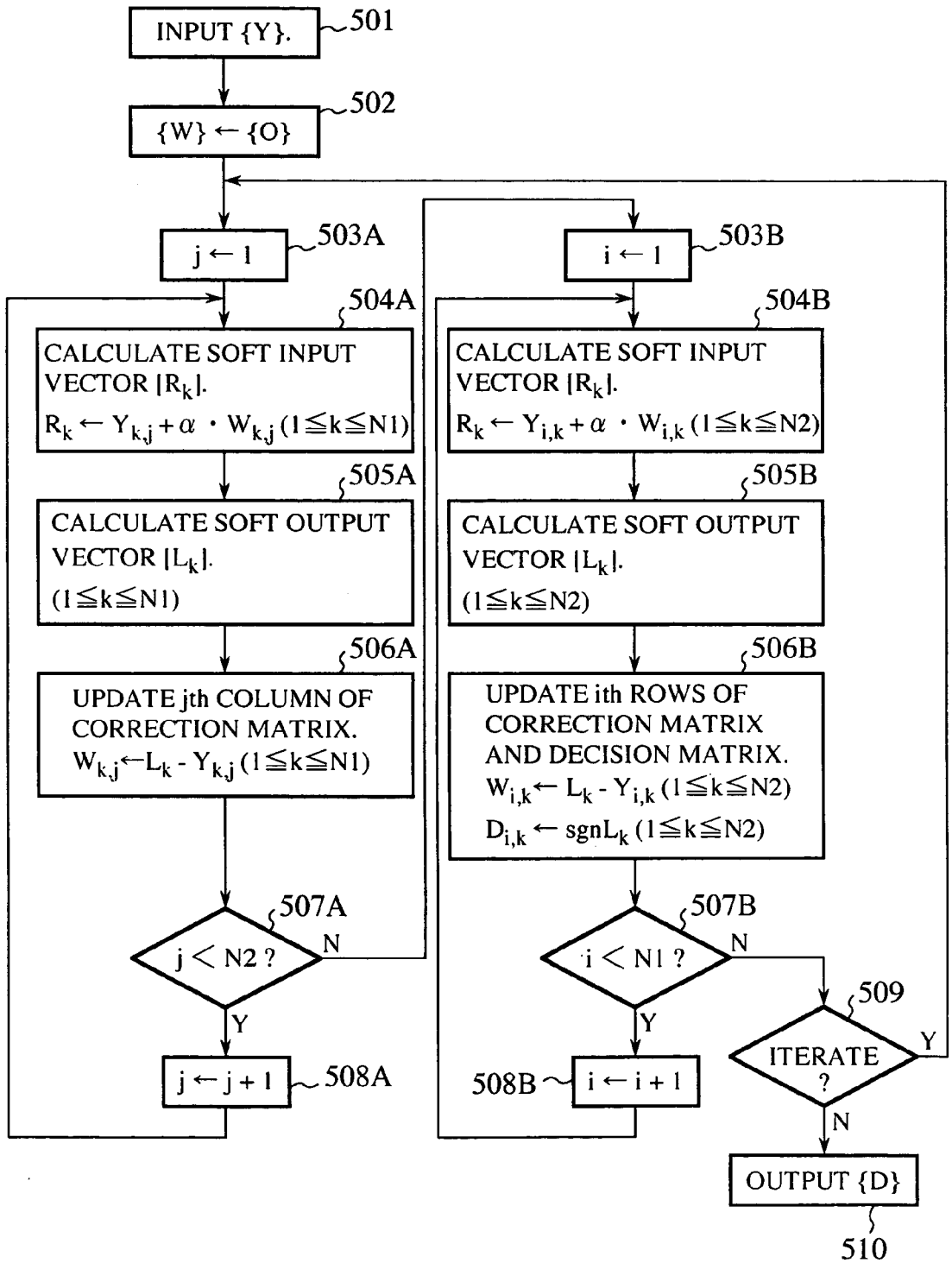
FIG. 5 is a flowchart illustrating a decoding method of a product code of an embodiment 1 in accordance with the present invention.

FIG. 5 is a flowchart illustrating the decoding method of a product code in accordance with the present invention. In FIG. 5, 501 is a step of inputting the input matrix {Y}; 502 is a step of setting an initial value into the correction matrix {W}; 503A is a step of setting an initial value into a counter j; 504A is a step of calculating soft input vectors $[R_k]$ (k=1, 2, ..., N1); 505A is a step of calculating soft output vectors $[L_k]$ (k=1, 2, ..., N1); 506A is a step of updating the correction matrix {W}; 507A is a step of comparing the value of the counter j; and 508A is a step of incrementing the value of the counter j.

In addition, 503B is a step of setting an initial value into a counter i; 504B is a step of calculating soft input vectors $[R_k]$ (k=1, 2, ..., N2); 505B is a step of calculating soft output vectors $[L_k]$ (k=1, 2, ..., N2); 506B is a step of updating the correction matrix {W} and the decision matrix {D}; 507B is a step of comparing the value of the counter i; 508B is a step of incrementing the value of the counter i; 509 is a step of making a decision as to whether to iterate the decoding of the product code; and 510 is a step of outputting the decision matrix {D}.

Next, the operation will be described in more detail with reference to the flowchart of FIG. 5. First, at step 501, the N1×N2 input matrix {Y} given by the foregoing expression (3) is input. At the next step 502, the initial value zero is stored into all the elements of the N1×N2 correction matrix {W} given by the following expression (15).

$$W = \begin{bmatrix} W_{1,1} & W_{1,2} & \cdots & W_{1,N2} \\ W_{2,1} & W_{2,2} & \cdots & W_{2,N2} \\ \vdots & \vdots & \ddots & \vdots \\ W_{N1,1} & W_{N1,2} & \cdots & W_{N1,N2} \end{bmatrix} \quad (15)$$

At step 503A, the initial value one is set into the counter j. At the next step 504A, decoding of the C1 code is started. At step 504A, jth column of the input matrix {Y} and the jth column of the correction matrix {W} are added element by element. Specifically, according to the following expression (16), the (k,j) elements $Y_{k,j}$ of the input matrix are added to the (k,j) elements $W_{k,j}$ of the correction matrix to calculate the soft input values $R_k$ (k=1, 2, ..., N1)

$$R_k \leftarrow Y_{k,j} + \alpha \cdot W_{k,j} \ (k=1, 2, \ldots, N1) \quad (16)$$

where α is an appropriate normalizing constant.

As in the description of the prior art, the jth column of the input matrix is denoted by $[Y_{k,j}]$, and that of the correction matrix is denoted by $[W_{k,j}]$ which are called an input vector and a correction vector, respectively. At step 505A, the soft output vectors $[L_k]$ (k=1, 2, ..., N1) are calculated from the soft input vectors $[R_k]$ calculated at step 504A. The details of the calculation method of the soft output vector at step 505A will be described later. At step 506A, the differences obtained by subtracting the input values $Y_{k,j}$ from the soft output values $L_k$ calculated at step 505A are stored in the jth column of the correction matrix {W} as the following expression (17).

$$W_{k,j} \leftarrow L_k - Y_{k,j} \ (k=1, 2, \ldots, N1) \quad (17)$$

Figure 3:
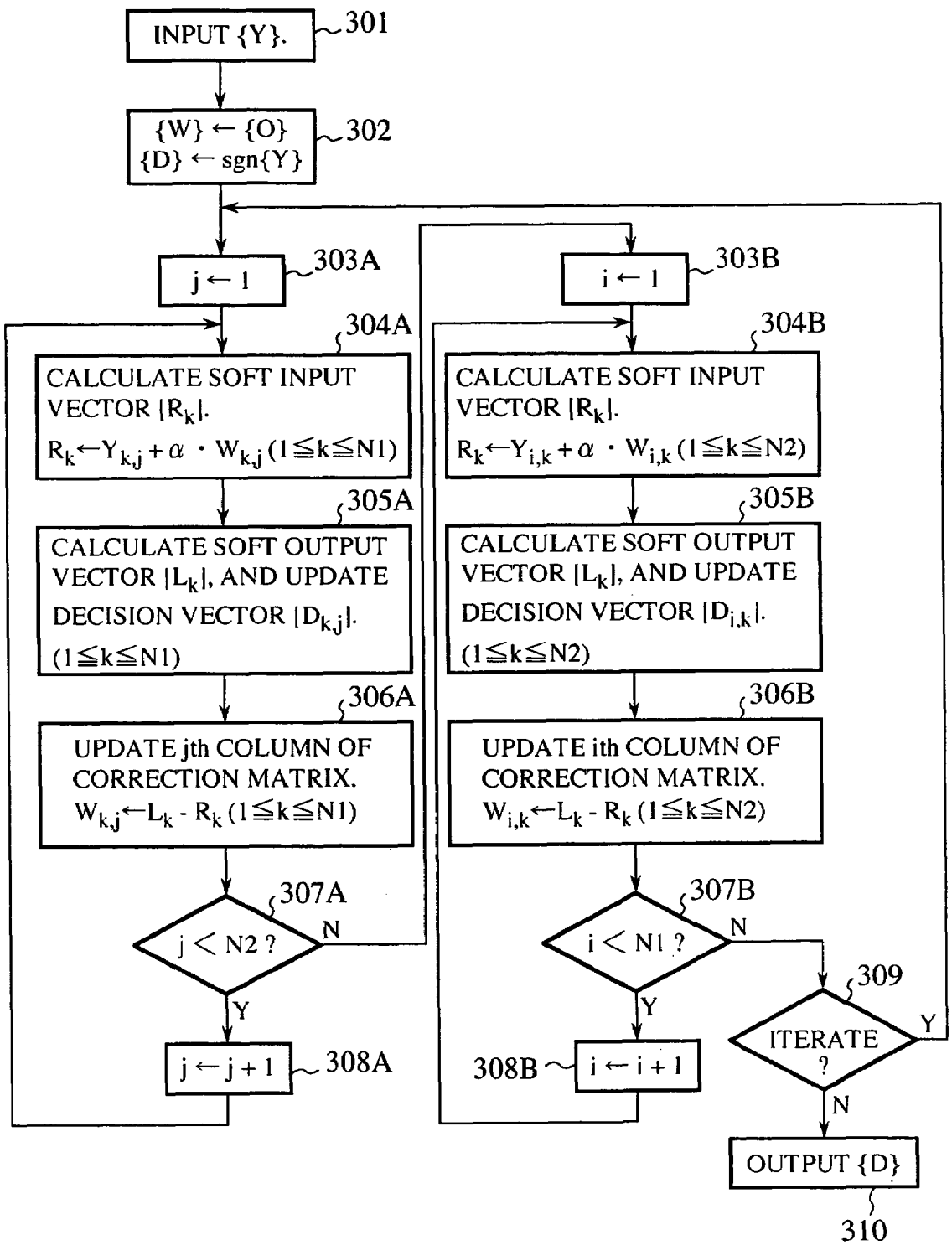
FIG. 3 is a flowchart illustrating a conventional decoding method of the product code.
Figure 4:
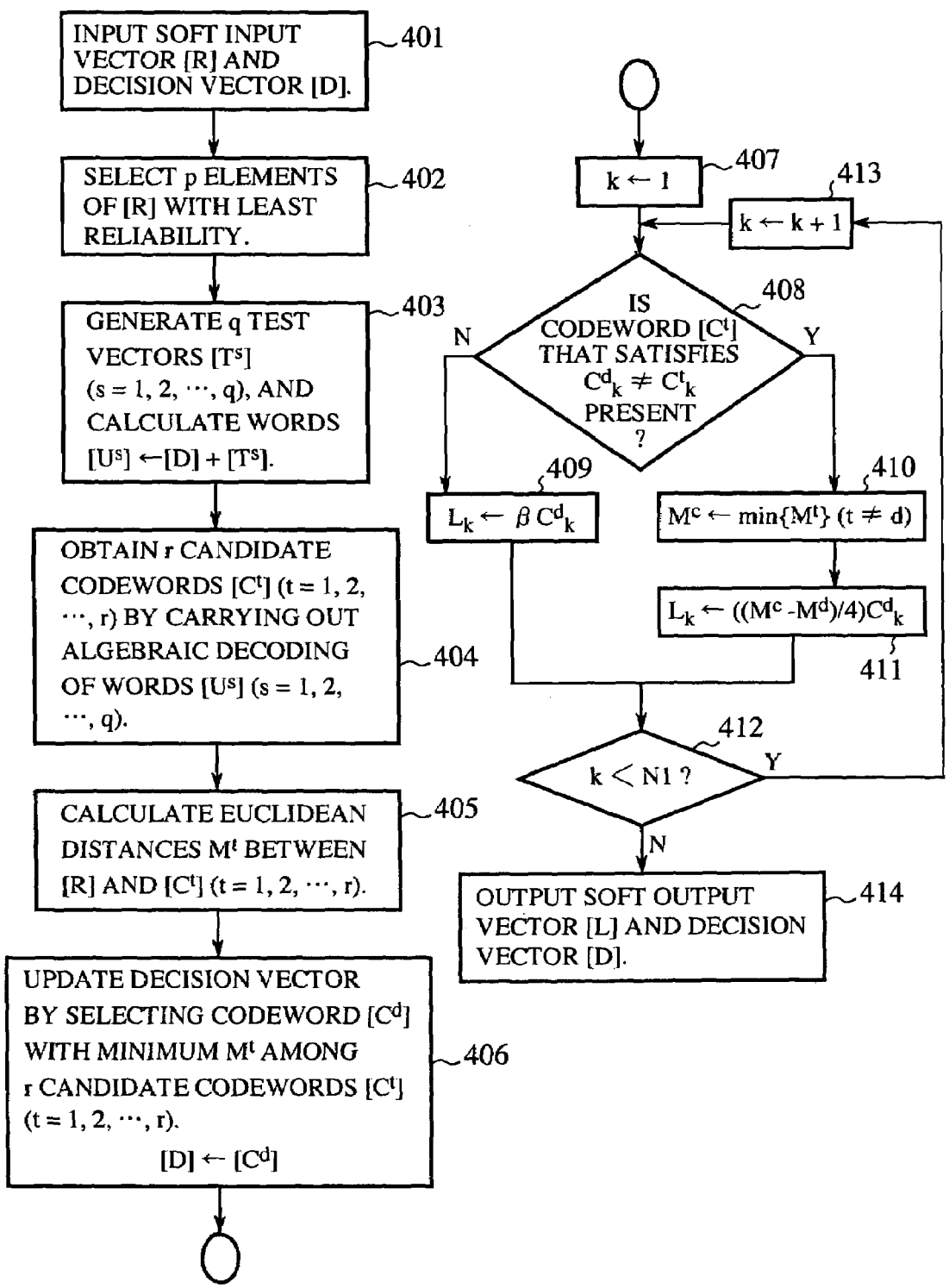
FIG. 4 is a flowchart illustrating the details of the block 305A of FIG. 3.

Although the correction vector $[W_{k,j}]$ is updated by subtracting the soft input vector $[R_k]$ from the soft output vector $[L_k]$ in the prior art (step 306A of FIG. 3), it is obtained by subtracting the input vector $[Y_{k,j}]$ from the soft output vector $[L_k]$ in the present invention. Thus, it offers an advantage of being able to obtain more accurate correction vectors better reflecting the previous correction information in the iteration of the decoding.

At step 507A, a decision is made as to whether the value of the counter j is less than N2. If it is less than N2, the value of the counter j is incremented at step 508A, followed by iterating the processing from step 504A and on. On the other hand, if the value of the counter is N2, the processing proceeds to step 503B, at which the decoding of the C2 code is started.

At step 503B, the initial value one is set into the counter i. At the next step 504B, the ith row of the input matrix {Y} and the ith row of the correction matrix {W} are added element by element. Specifically, according to the following expression (18), the (i,k) elements $Y_{i,k}$ of the input matrix are added to the (i,k) elements $W_{i,k}$ of the correction matrix to calculate the soft input values $R_k$ (k=1, 2, ..., N2).

$$R_k \leftarrow Y_{i,k} + \alpha \cdot W_{i,k} \ (k=1, 2, \ldots, N2) \quad (18)$$

where α is an appropriate normalizing constant.

In the following description, the ith row of the input matrix is denoted by $[Y_{i,k}]$ and that of the correction matrix is denoted by $[W_{i,k}]$, which are called an input vector and a correction vector, respectively, as in the decoding of the foregoing C1 code. At step 505B, the soft output vector $[L_k]$ (k=1, 2, ..., N2) is calculated from the soft input vector $[R_k]$ calculated at step 504B.

At step 506B, the differences obtained by subtracting the input vector from the soft output vector calculated at step 505B are stored in the ith row of the correction matrix {W} according to the following expression (19).

$$W_{i,k} \leftarrow L_k - Y_{i,k} \ (k=1, 2, \ldots, N2) \quad (19)$$

In addition, the hard decisions of Lk are substituted into the (i,k) elements $D_{i,k}$ of the decision matrix {D} as shown by the following expression (20).

$$D_{i,k} = \begin{cases} 0 & (L_k \geq 0) \\ 1 & (L_k < 0) \end{cases} \ (k = 1, 2, \ldots, N2) \quad (20)$$

At step 507B, a decision is made as to whether the value of the counter i is less than N1 or not. If it is less than N1, the value of the counter i is incremented at step 508B, followed by iterating the processing from step 504B and on. On the other hand, if the value of the counter i is N1, the processing proceeds to step 509. Up to this time, the decoding of the C1 code and C2 code constituting the product code has been completed once. At step 509, a decision is made as to whether to iterate the decoding or not. To iterate the decoding, the processing proceeds to step 503A to restart the decoding of the C1 code. On the other hand, to stop the decoding, the processing proceeds to step 510, at which the decision matrix {D} is output. Thus, the processing is completed.

The data $D_{i,j}$ (i=1, 2, ..., K1; j=1, 2, ..., K2) in the K1×K2 decision matrix {D} represent the estimated information data. The step 509 can calculate the syndromes of the decision matrix {D} to check whether any error remains or not so that if a decision is made that an error is present, the decoding is iterated, or else the decoding can be completed.

Figure 6:
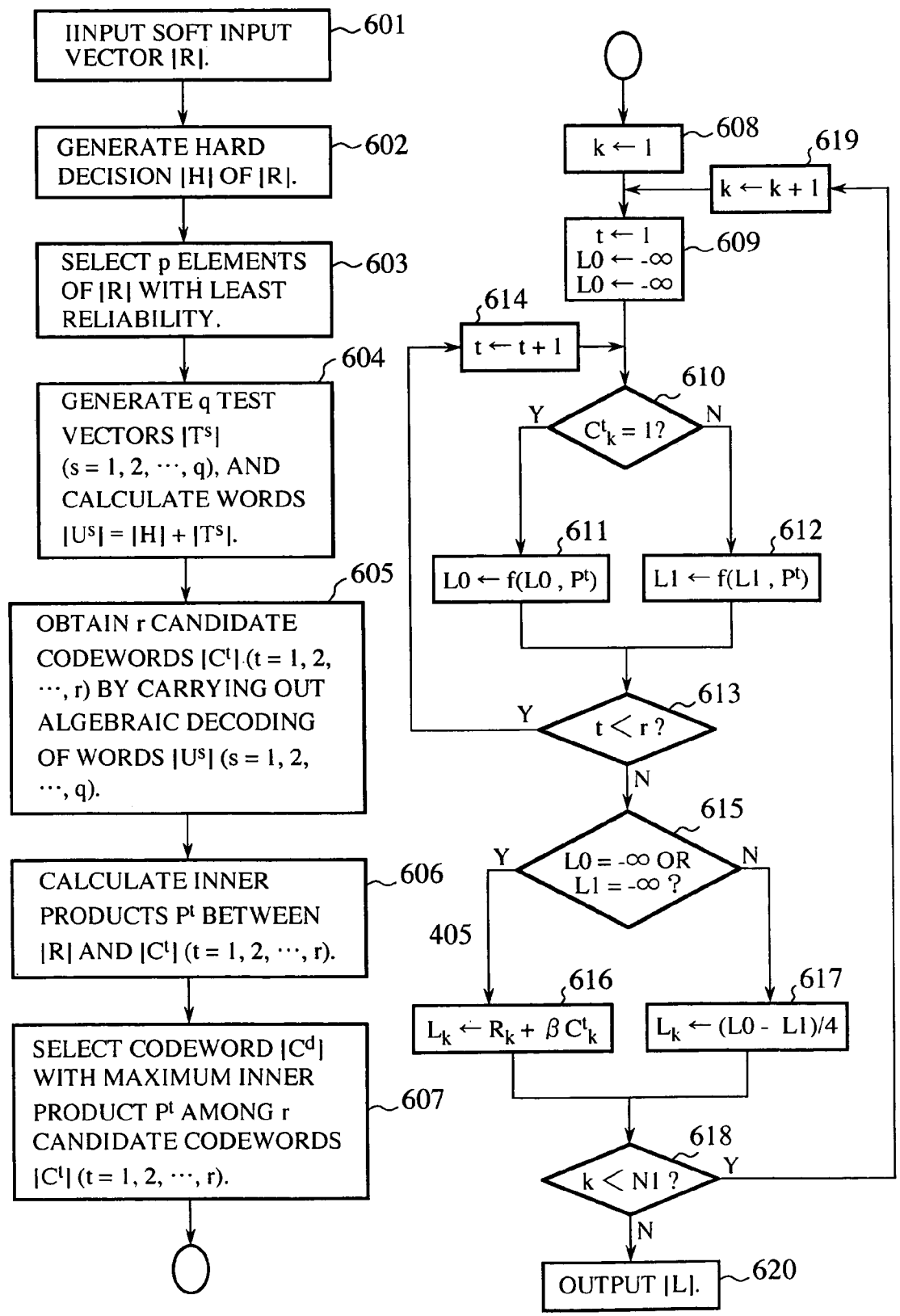
FIG. 6 is a flowchart illustrating the details of the block 505A of FIG. 5.

Next, the soft input/soft output decoding of the C1 code at step 505A will be described. FIG. 6 is a flowchart illustrating the details of step 505A. Referring to FIG. 6, the operation of the soft input/soft output decoding of the C1 code will be described. At step 601, the soft input vector $[R_k]$ is input. At step 602, a hard decision vector $[H_k]$ of the soft input vector $[R_k]$ is generated according to the following expression (21).

$$H_k = \begin{cases} 0 & (R_k \geq 0) \\ 1 & (R_k < 0) \end{cases} \quad (21)$$

At step 603, p elements with least absolute values are selected from the soft input vector $[R_k]$. The positions of the p elements selected are denoted by k1, k2, ..., and kp. At step 604, a test vector [T] is generated whose elements $T_{km}=0$ or 1 at the p positions km (m=1, 2, ..., p) which are selected at step 603, with the remaining elements $T_k=0$ (k≠km). Since the total of $q=2^p$ test vectors are present, they are denoted as $[T^s]$ (s=1, 2, ..., q) using the suffix s. The resultant test vectors $[T^s]$ and the hard decision vector H generated at step 602 are added element by element to generate words $[U^s]$ given by the following expression (22) for carrying out algebraic decoding of the C1 code.

$$[U^s]=[H]+[T^s] \ (s=1, 2, \ldots, q) \quad (22)$$

At step 605, r candidate codewords $[C^t]=(C^t_1, C^t_2, \ldots, C^t_{N1})$ (t=1, 2, ..., r) are generated by decoding the words $[U^s]$, which are generated at step 604, using the algebraic decoding of the C1 code.

At step 606, the inner products $P^t$ (t=1, 2, ..., r) between the soft input vector [R] and the candidate codewords $[C^t]$ are calculated. The inner products $P^t$ between the soft input vector [R] and the candidate codewords $[C^t]$ are given by the following expression (23).

$$P^t = 2\sum_{k=1}^{N1} R_k C^t_k \quad (23)$$

At step 607, the codeword $[C^d]$ that gives the maximum value of the inner products $P^t$ calculated at step 606 is selected. At step 608, the initial value one is set into the counter k. At step 609, the initial value one is set in the counter t, and variables L0 and L1 are set at "−∞" that indicates the minimum value the computer or hardware can represent. At step 610, a decision is made as to whether the kth element $C^t_k$ of the tth candidate codeword $[C^t]$ is zero or not. If the element $C^t_k$ is zero, the processing proceeds to step 611, or else it proceeds to step 612.

At step 611, the following expression (24) is calculated, and then the processing proceeds to step 613.

$$L0 \leftarrow f(L0, P^t) \quad (24)$$

At step 612, the following expression (25) is calculated, and then the processing proceeds to step 613.

$$L1 \leftarrow f(L1, P^t) \quad (25)$$

where the function f in the expressions (24) and (25) is given by the following expression (26).

$$f(a,b)=\max(a,b)+\log(1+e^{-|a-b|}) \quad (26)$$

where "max" indicates to select the greater one of the two variables.

At step 613, a decision is made as to whether the counter t is less than the total number r of the candidate codewords generated at step 605 or not. When t is less than r, the processing proceeds to step 614, at which the value of the counter t is incremented to iterate the processing from step 610 and on. On the other hand, if the counter t agrees with r, the processing proceeds to step 615.

At step 615, a decision is made as to whether the variable L0 or L1 equals −∞ or not. If it is equal, the processing proceeds to step 616, or else it proceeds to step 617. At step 616, the soft output value given by the following expression (27) is calculated.

$$L_k \leftarrow R_k + \beta C^d_k \quad (27)$$

where β is an appropriate normalizing constant. At step 617, the soft output value given by the following expression (28) is calculated.

$$L_k \leftarrow (L0-L1)/4 \quad (28)$$

At step 618, a decision is made as to whether the value of the counter k is equal to N1 or not. If k is less than N1, the processing proceeds to step 619, at which the value of the counter k is incremented to iterate the processing from step 609 and on. On the other hand, if they are equal, the processing proceeds to step 620, at which the soft output vector $[L_k]$ is output, followed by completing the entire processing. Thus, the soft input/soft output decoding of the C1 code at step 505A has been completed. The soft input/soft output decoding of the C2 code at step 505B is the same as that of the C1 code at step 505A.

As described above, the present embodiment 1 is configured such that the soft output values $L_k$ are calculated using all the candidate codewords generated at step 605. Accordingly, it has an advantage of being able to achieve more accurate soft output values than the conventional techniques. In the following paragraphs, the formulae for calculating the soft output values of the prior art and the present invention will be compared. Here, the description is made by way of example of calculating the soft output values of the C1 code. It is known that when the soft input vector $[R_k]$ is given, the accurate value of the kth soft output value $L_k$ is calculated by the following expression (29).

$$L_j \propto \log \frac{\sum_{C_j=+1} e^{-(R-C)^2}}{\sum_{C_j=-1} e^{-(R-C)^2}} \quad (29)$$

where the numerator is the sum total of the codewords $C=[C_k]$ (k=1, 2, ..., N1) of the C1 code having the value $C_j=+1$, and the denominator is the sum total of the codewords $C=[C_k]$ of the C1 code having the $C_j=-1$.

Assume that the codeword among the codewords $C=[C_k]$, which has the value $C_j=+1$ and is closest to the vector $[R_k]$ in terms of the Euclidean distance is denoted by $[C^{+1}{}_k]$, and that the codeword among the codewords $C=[C_k]$, which has the value $C_j=-1$ and is closest to the vector $[R_k]$ in terms of the Euclidean distance is denoted by $[C^{-1}{}_k]$, the foregoing expression (29) is approximated by the following expression (30).

$$L_j = -\frac{(R-C^{+1})^2 - (R-C^{-1})^2}{4} \tag{30}$$

The calculation of the soft output values of the prior art is based on expression (30). In contrast, the present embodiment, limiting the codewords $[C_k]$ of the denominator and numerator of expression (29) to the candidate codewords $[C^t]$ (t=1, 2, . . . , r) generated at the codeword generating step, calculates the soft output values by the following expression (31) using instead of the Euclidean distance the inner product between the vector $[R_k]$ and the candidate codeword $[C^t]$, which is easier to calculate than the Euclidean distance.

$$L_j = \frac{1}{4}\left[\log\left(\sum_{C_{j=+1}^t} e^{2R\cdot C^t}\right) - \log\left(\sum_{C_{j=-1}^t} e^{2R\cdot C^t}\right)\right] \tag{31}$$

The first and second terms of the expression (31) can be recursively calculated using the relationship of the following expression (32). In particular, storing quantized values of the function L given by the following expression (33) into a table enables the speedup of the calculation of expression (31).

$$\log(e^a+e^b) = \max(a,b) + \log(1+e^{-|a-b|}) \tag{32}$$

$$L(x) = \log(1+e^{-x}) \quad (x>0) \tag{33}$$

With the foregoing configuration, the present embodiment 1 of the decoding method of a product code offers an advantage of being able to generate the more accurate soft output values. In addition, since it is configured such that the correction vectors take account of the previous decoding results, it can improve the decoding performance markedly.

The present embodiment 1 can be modified in various ways. For example, when the received values of the product codes are given by the hard decision, the decoding method of the present embodiment is applicable under the condition that the soft input values are placed at M when the hard decision is zero, and at −M when the hard decision is one, where M is an appropriate value.

In addition, it is possible to modify the present embodiment 1 in such a manner that it calculates the syndromes of the product codes at step 509, and if all the syndromes are zero, it completes the decoding, or else it iterates the decoding. Thus, it offers an advantage of being able to eliminate useless iteration.

Embodiment 2

Figure 7:
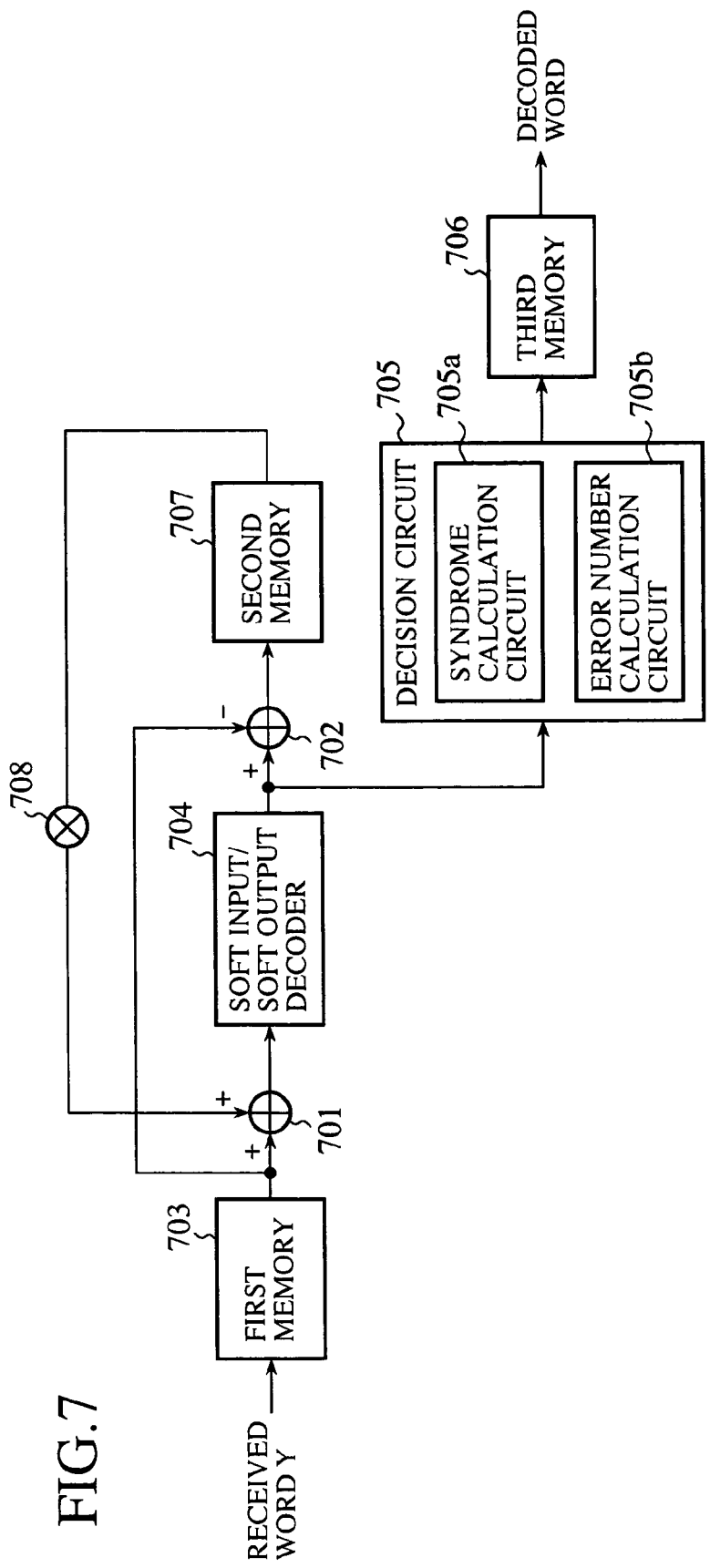
FIG. 7 is a block diagram showing a configuration of a decoding apparatus of a product code of an embodiment 2 in accordance with the present invention.

The decoding method of a product code described above in connection with the embodiment 1 can be implemented by hardware. FIG. 7 is a block diagram showing a configuration of a decoding apparatus for the product code including the same C1 code and C2 code. In FIG. 7, the reference numeral 701 designates an adder; 702 designates a subtracter; 703 designates a first memory for storing a received word of the product code supplied from the modulator on the transmitting side; 704 designates a soft input/soft output decoder for carrying out the soft input/soft output decoding of the C1 code and C2 code; 705 designates decision circuit for deciding the transmitted codeword from the soft output values supplied by the soft input/soft output decoder 704; 706 designates a third memory for storing the transmitted codeword decided by the decision circuit 705; 707 designates a second memory for storing the correction value supplied from the subtracter 702; and 708 designates a normalizing circuit for normalizing the correction value supplied from the second memory 707. In the decision circuit 705, the reference numeral 705a designates a syndrome calculation circuit for calculating the syndromes of the transmitted codeword to decide whether an error is present or not; and 705b is an error number calculation circuit for measuring the number of errors from the estimated transmitted codeword and the received word to monitor the state of the communication channel.

Next, the operation of the decoding apparatus of FIG. 7 will be described. First, the received word Y supplied from the demodulator is stored in the first memory 703. To decode the C1 code (vertical direction) or C2 code (horizontal direction) of the product code, the correction value stored in the specified address of the second memory 707 is read out and supplied to the adder 701 after passing through the normalization by the normalizing circuit 708. The adder 701 adds the received value stored at the specified address of the first memory 703 and the correction value supplied from the normalizing circuit 708 to generate the soft input value. At the first decoding, the reading from the second memory 707 is skipped, so that the adder 701 delivers the received value to the soft input/soft output decoder 704 without change.

The soft input value generated by the adder 701 is supplied to the soft input/soft output decoder 704. Receiving the soft input value associated with one codeword of the C1 code or C2 code, (that is, the soft input vector described in the foregoing embodiment 1), the soft input/soft output decoder 704 starts the decoding in accordance with the flowchart of FIG. 6.

Figure 8:
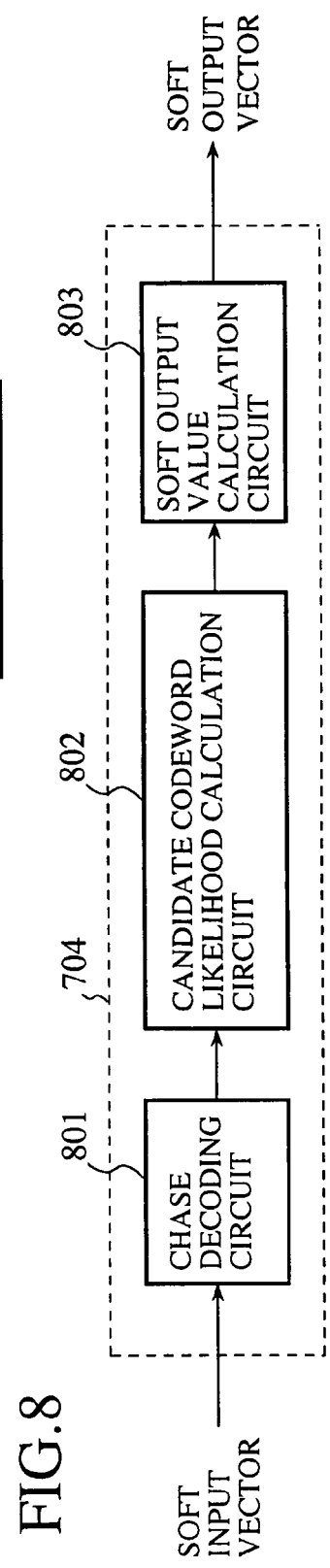
FIG. 8 is a block diagram illustrating the soft input/soft output decoder of FIG. 7.

FIG. 8 is a block diagram showing a configuration of the soft input/soft output decoder 704. In FIG. 8, the reference numeral 801 designates a Chase decoding circuit for generating a candidate of the transmitted codeword from the soft input vector; 802 designates a candidate codeword likelihood calculation circuit for calculating the likelihood of the candidate codeword; and 803 designates a soft output value calculation circuit for calculating the soft output value from the candidate codeword. Since the Chase decoding circuit 801 belongs to a known technique, its details will be omitted here. See, D. Chase, "A class of algorithms for decoding block codes with channel measurement information", (IEEE Trans. Inform. Theory, Vol. IT-18, pp. 170–182).

Next, the operation of the soft input/soft output decoder 704 of FIG. 8 will be described. The Chase decoding circuit 801 carries out the processing from step 601 to step 605 of FIG. 6 to generate the candidate codewords $[C^t]$ (t=1, 2, . . . , r) from the soft input vector [R].

The candidate codewords $[C^t]$ (t=1, 2, . . . , r) generated by the Chase decoding circuit 801 are supplied to the candidate codeword likelihood calculation circuit 802. The candidate codeword likelihood calculation circuit 802 calculates the inner products $P^t$ between the soft input vector

[R] and the candidate codewords $[C^t]$ (t=1, 2, ..., r) given by the foregoing expression (23), and detects the candidate codeword $[C^d]$ giving the maximum inner product. The candidate codeword likelihood calculation circuit 802 supplies the inner products Pt and the maximum likelihood codeword $[C^d]$ to the soft output value calculation circuit 803.

Figure 9:
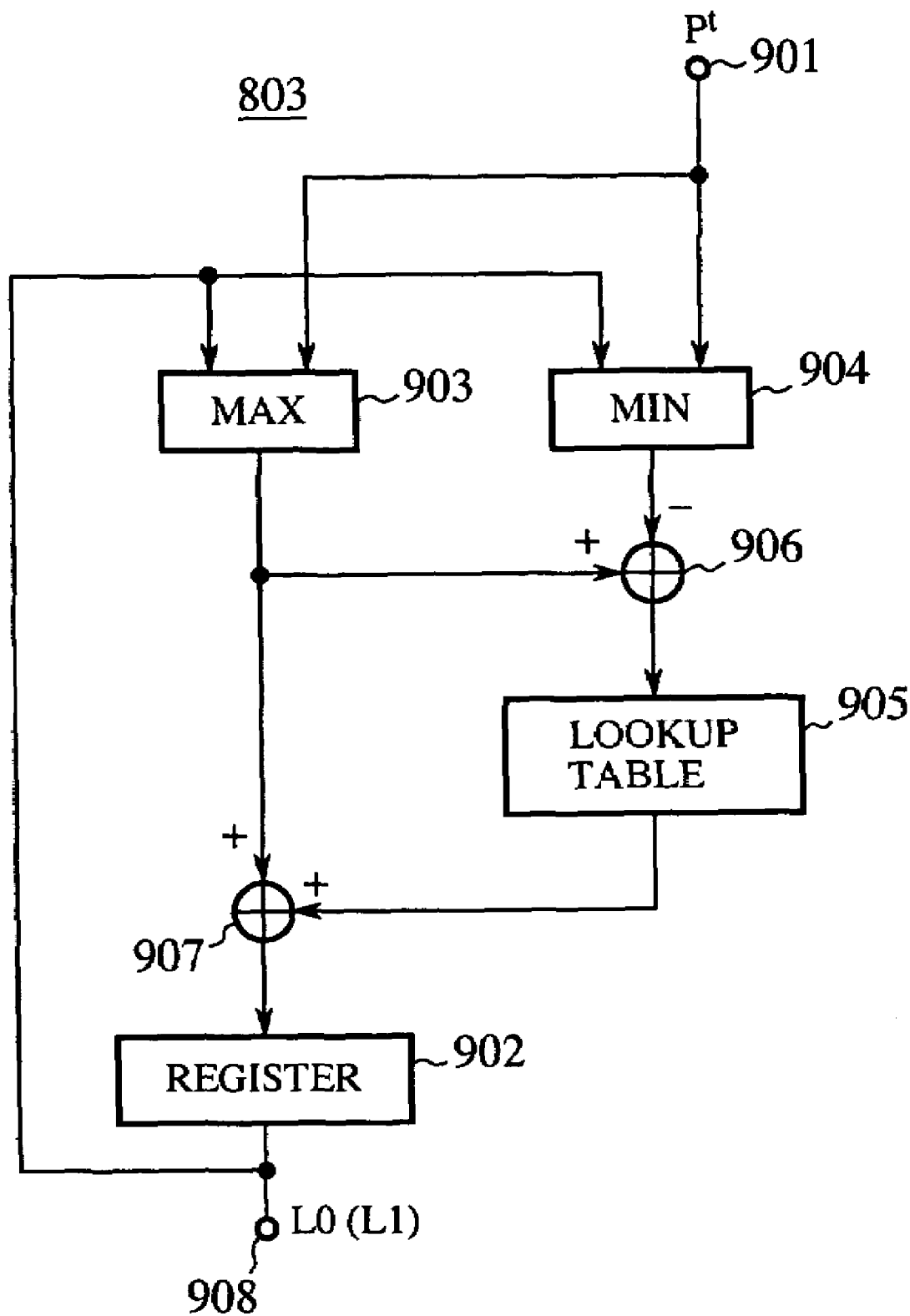
FIG. 9 is a block diagram showing a configuration of the soft output value calculation circuit of FIG. 8.

The soft output value calculation circuit 803 generates the soft output values according to the foregoing expression (27) or (28). FIG. 9 shows a configuration of the soft output value calculation circuit 803 for calculating the variable L0 or L1. In FIG. 9, the reference numeral 901 designates an input terminal to which the inner product $P^t$ is applied; 902 designates a register for storing a calculation result; 903 designates a MAX circuit for selecting a greater one of the two inputs and for outputting the selected one; 904 designates a MIN circuit for selecting a smaller one of the two inputs and for outputting the selected one; 905 designates a lookup table that stores the quantized values of the foregoing expression (33); 906 designates a subtracter for subtracting the output of the MIN circuit 904 from the output of the MAX circuit 903; 907 designates an adder for adding the output of the MAX circuit 903 and the output of the lookup table 905; and 908 designates an output terminal for outputting the content of the register 902.

Next, the operation of the soft output value calculation circuit 803 of FIG. 9 will be described by way of example of calculating the variable L0. A sufficiently small value is placed into the register 902 as its initial value. The inner product $P^t$ of the candidate codeword $[C^t]$ whose kth value $C^t_k$ is zero is input from the input terminal 901. The MAX circuit 903 compares the inner product $P^t$ with the data stored in the register 902, and selects and supplies the greater one to the subtracter 906 and adder 907. On the other hand, the MIN circuit 904 compares the inner product $P^t$ with the data stored in the register 902, and selects and supplies the smaller one to the subtracter 906.

The subtracter 906 subtracts the output data of the MIN circuit 904 from the output data of the MAX circuit 903, and supplies the resultant value to the lookup table 905. The lookup table 905 reads the logarithmic value given by expression (33), and supplies the resultant value to the adder 907. The adder 907 adds the output of the MAX circuit 903 and the output of the lookup table 905, and stores the sum to the register 902.

Since the variable L1 can be calculated in the same manner as the variable L0 using the circuit as shown in FIG. 9, the description thereof is omitted here. The soft output value is generated from the calculated variables L0 and L1 using the foregoing expression (28). If the variable L0 or L1 is not calculated, the soft output value is generated from the soft input value and the element of the maximum likelihood codeword $[C^d]$ using expression (27).

The soft output value generated by the soft output value calculation circuit 803 of the soft input/soft output decoder 704 is supplied to the decision circuit 705 and subtracter 702. The subtracter 702 subtracts the received value from the soft output value to generate the correction value, and stores it to a particular address of the second memory 707. The decision circuit 705 makes a decision of the transmitted codeword from the soft output value, and stores it to a particular address of the third memory 706.

With the foregoing configuration, the decoding apparatus of a product code of the present embodiment 2 can generate highly accurate soft output values using the lookup table. In addition, since the correction value is generated by subtracting the received value from the soft output value, the present embodiment 2 can generate more effective correction value.

Although it is assumed that the C1 code is the same as the C2 code in the foregoing description, the decoding apparatus can be configured in the same manner when they are different. Specifically, it is enough for the soft input/soft output decoder to have a first Chase decoder for the C1 code and a second Chase decoder for the C2 code, with sharing the remaining circuits.

Furthermore, although the foregoing configuration comprises only one soft input/soft output decoder, multiple decoders installed in parallel can enhance the speed of the decoding apparatus.

Moreover, using the syndrome calculation circuit 705*a*, the decision circuit 705 can calculate the syndromes of the transmitted codeword to decide whether an error is present or not. Thus, the present embodiment 2 can iterate the decoding if the error is present, and complete the decoding otherwise. As a result, it offers an advantage of being able to eliminate useless iteration. Furthermore, using the error number calculation circuit 705*b*, the decision circuit 705 can measure the number of errors from the estimated transmitted codeword and the received word to monitor the state of the communication channel. This offers an advantage of being able to facilitate the setting of the number of times of the iteration of the decoding. That is, when the state of the communication channel is bad, the number of times of the iteration is increased, and when it is good, it is reduced.

The decoding apparatus of a product code is suitable for establishing the good digital transmission, and can implement the high performance digital transmission system by connecting the encoding apparatus of the product code with the decoding apparatus via a transmission medium. Incidentally, it is obvious that not only a wireless channel or an optical fiber can be used as the transmission medium, but also a recording medium such as an optical disk is usable.

What is claimed is:

1. A computing apparatus-implemented decoding method of a product code including a binary linear C1 code with a code length N1 and an information length K1 and a binary linear C2 code with a code length N2 and an information length K2, said decoding method of a product code comprising:

a first soft input value generating step of generating a first soft input value by adding a received value of the C1 code and a predetermined correction value;

a first soft output value generating step of generating a first soft output value from the first soft input value generated at the first soft input value generating step, by carrying out soft input/soft output decoding of the C1 code;

a first correction value update step of updating a correction value by subtracting the received value of the C1 code from the first soft output value generated at the first soft output value generating step to generate an updated correction value equal to the difference between the received value of the C1 code and the first soft output value;

a second soft input value generating step of generating a second soft input value by adding a received value of the C2 code and the correction value updated at the first correction value update step;

a second soft output value generating step of generating a second soft output value from the second soft input value generated at the second soft input value generating step, by carrying out soft input/soft output decoding of the C2 code;

a codeword estimating step of estimating a transmitted codeword from the soft output value generated at the second soft output value generating step; and a second correction value update step of updating the correction value by subtracting the received value of the C2 code from the second soft output value generated at the second soft output value generating step, wherein the product code is iteratively decoded by inputting the updated correction value to the first soft input value generating step.

2. The decoding method of a product code according to claim 1, wherein the first soft output value generating step comprises:

a hard decision generating step of generating a hard decision from the first soft input value;

a position detecting step of detecting p positions with least reliability from the first soft input value, where p is a positive integer;

a decoding input value generating step of generating test vectors in accordance with the positions detected at the position detecting step, followed by generating q decoding input values for carrying out C1 decoding by adding the test vectors and the hard decision, where q is a positive integer;

a C1 codeword generating step of generating r codewords $[C^t]$ (t=1, 2, ..., r) of the C1 code from the q decoding input values by C1 decoding;

a likelihood calculation step of calculating likelihoods $P^t$ (t=1, 2, ..., r) of the r C1 codewords;

a maximum likelihood codeword detecting step of detecting a codeword $[C^d]$ that gives a maximum value of the likelihoods $P^t$ (t=1, 2, ..., r);

an initial value setting step of setting initial values of variables L0 and L1; and an update step of updating the variables L0 and L1 for each of the r C1 codewords $[C^t]$ (t=1, 2, ..., r) beginning from t=1 such that if a kth value (k=1, 2, ..., N1) of each C1 codeword $[C^t]$ is zero, then replace the variable L0 by a first value equal to a sum of a greater one of the variable L0 and $P^t$ and a correction value of a difference between them, and if not, then replace the variable L1 by a second value equal to a sum of a greater one of the variable L1 and $P^t$ and a correction value of a difference between them, with incrementing t one by one from one to r, and wherein the kth soft output value is calculated from a difference between the variables L0 and L1, said kth soft output value defining said first soft output value.

3. The decoding method of a product code according to claim 2, wherein the update step, including a correction value table that stores the correction values, selects the correction values from the correction value table in response to the difference between the variable L0 and $P^t$ and to the difference between the variable L1 and $P^t$.

4. The decoding method of a product code according to claim 2, wherein the soft output value generating step generates the soft output value by adding to the soft input value a value proportional to an element of the maximum likelihood codeword when one of the variables L0 and L1 is uncalculable.

5. The decoding method of a product code according to claim 2, wherein the second soft output value generating step has a same structure as the first soft output value generating step defined in claim 3, wherein the codeword estimating step estimates the codeword in accordance with a sign of the soft output value generated at the second soft output value generating step.

6. The decoding method of a product code according to claim 1, wherein the decoding of the codeword is completed without iterating the decoding if all syndromes of the codeword estimated at the codeword estimating step are zero.

7. The decoding method of a product code according to claim 1, further comprising a decision step of deciding a degree of reliability of received values of the C1 code and C2 code, wherein when the decision is a hard decision, the decoding is carried out after placing the soft input value at M when the hard decision value is zero, and at −M when the hard decision value is one, where M is an appropriate constant.

8. The decoding method of a product code according to claim 1, wherein the second correction value update step updates the correction value to generate an updated correction value equal to the difference between the received value of the C2 code and the second soft output value.

* * * * *

UNITED STATES PATENT AND TRADEMARK OFFICE
CERTIFICATE OF CORRECTION

PATENT NO. : 7,185,259 B2
APPLICATION NO. : 10/209923
DATED : February 27, 2007
INVENTOR(S) : Hachiro Fujita et al.

It is certified that error appears in the above-identified patent and that said Letters Patent is hereby corrected as shown below:

Claim 5, column 16, line 21:

The line reading "claim 3" should read --claim 2--.

Claim 7, column 16, line 33:

The line reading "when the decision is a hard decision" should read --when the decided degree of reliability is a hard decision--.

Claim 7, column 16, line 34:

The line reading "placing" should read --setting--.

Claim 7, column 16, lines 34-35:

The line reading "at M" should read --to M--.

Claim 7, column 16, line 35:

The line reading "at -M" should read --to -M--.

Signed and Sealed this

Twenty-sixth Day of June, 2007

JON W. DUDAS
*Director of the United States Patent and Trademark Office*